United States Patent
Guo et al.

(10) Patent No.: US 9,728,292 B2
(45) Date of Patent: Aug. 8, 2017

(54) I-LAYER VANADIUM-DOPED PIN TYPE NUCLEAR BATTERY AND THE PREPARATION PROCESS THEREOF

(75) Inventors: Hui Guo, Xi'an (CN); Keji Zhang, Xi'an (CN); Yuming Zhang, Xi'an (CN); Yujuan Zhang, Xi'an (CN); Chao Han, Xi'an (CN); Yanqiang Shi, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 777 days.

(21) Appl. No.: 14/349,933

(22) PCT Filed: May 31, 2012

(86) PCT No.: PCT/CN2012/076325
§ 371 (c)(1),
(2), (4) Date: Apr. 4, 2014

(87) PCT Pub. No.: WO2013/056556
PCT Pub. Date: Apr. 25, 2013

(65) Prior Publication Data
US 2014/0225472 A1 Aug. 14, 2014

(30) Foreign Application Priority Data
Oct. 19, 2011 (CN) .......................... 2011 1 0319001

(51) Int. Cl.
*G21H 1/06* (2006.01)
*H01L 29/868* (2006.01)
(Continued)

(52) U.S. Cl.
CPC ............. *G21H 1/06* (2013.01); *H01L 21/046* (2013.01); *H01L 21/0495* (2013.01);
(Continued)

(58) Field of Classification Search
CPC .................................. G01H 1/06; G01H 1/12
(Continued)

(56) References Cited

U.S. PATENT DOCUMENTS

| 5,606,213 A | 2/1997 | Kherani |
| 5,709,745 A * | 1/1998 | Larkin .................... C30B 25/02 |
| | | 117/96 |

(Continued)

FOREIGN PATENT DOCUMENTS

| CN | 101236794 | 8/2008 |
| CN | 101599308 | 12/2009 |
| CN | 102354540 | 2/2012 |

OTHER PUBLICATIONS

International Search Report for corresponding international application No. PCT/CN2012/076325 dated Sep. 13, 2012.

*Primary Examiner* — Thomas Truong
(74) *Attorney, Agent, or Firm* — Swanson & Bratschun, L.L.C.

(57) ABSTRACT

A layer I vanadium-doped PIN-type nuclear battery, including from top to bottom a radioisotope source layer(1), a p-type ohm contact electrode(4), a $SiO_2$ passivation layer(2), a $SiO_2$ compact insulation layer(3), a p-type SiC epitaxial layer(5), an n-type SiC epitaxial layer(6), an n-type SiC substrate(7) and an n-type ohm contact electrode(8). The doping density of the p-type SiC epitaxial layer(5) is $1\times10^{19}$ to $5\times10^{19}$ cm$^{-3}$, the doping density of the n-type SiC substrate(7) is $1\times10^{18}$ to $7\times10^{18}$ cm$^{-3}$. The n-type SiC epitaxial layer(6) is a low-doped layer I formed by injecting vanadium ions, with the doping density thereof being $1\times10^{13}$ to $5\times10^{14}$ cm$^{-3}$. Also provided is a preparation method for a layer I vanadium-doped PIN-type nuclear battery. The present invention solves the problem that the doping density of layer I of the exiting SiC PIN-type nuclear battery is high.

6 Claims, 3 Drawing Sheets

(51) Int. Cl.
*H01L 21/04* (2006.01)
*H01L 29/66* (2006.01)
*H01L 29/36* (2006.01)
*H01L 29/861* (2006.01)
*H01L 29/16* (2006.01)
*H01L 29/167* (2006.01)
*H01L 21/02* (2006.01)

(52) U.S. Cl.
CPC ........ *H01L 29/167* (2013.01); *H01L 29/1608* (2013.01); *H01L 29/36* (2013.01); *H01L 29/6606* (2013.01); *H01L 29/861* (2013.01); *H01L 29/868* (2013.01); *H01L 21/0262* (2013.01); *H01L 21/02378* (2013.01); *H01L 21/02529* (2013.01); *H01L 21/02579* (2013.01)

(58) Field of Classification Search
USPC .................................. 310/303; 136/253, 258
See application file for complete search history.

(56) References Cited

U.S. PATENT DOCUMENTS

| | | | |
|---|---|---|---|
| 6,753,469 B1* | 6/2004 | Kolawa | G21H 1/04 136/253 |
| 7,199,303 B2* | 4/2007 | Machida | H01L 31/03682 136/249 |
| 2007/0080605 A1 | 4/2007 | Chandrashekhar | |
| 2009/0026879 A1* | 1/2009 | Prelas | G21H 1/06 310/303 |

* cited by examiner

I-LAYER VANADIUM-DOPED PIN TYPE NUCLEAR BATTERY AND THE PREPARATION PROCESS THEREOF

RELATED APPLICATIONS

This application is a 35 U.S.C. §371 national phase application of PCT/CN2012/076325 (WO 2013/056556), filed on May 31, 2012, entitled " Layer I Vanadium-Doped Pin-Type Nuclear Battery And Preparation Method Thereof", which application claims the benefit of Chinese Application Serial No. CN 201110319001.9, filed Oct. 19, 2011, which is incorporated herein by reference in its entirety.

TECHNICAL FIELD

The present invention belongs to microelectronic technology and especially relates to an I-layer vanadium-doped PIN type nuclear battery and preparation process thereof. Said PIN type nuclear battery can be used to directly convert the nuclear energy irradiated by isotope to electric energy.

BACKGROUND TECHNOLOGY

In 1953, Rappaport found that β-particles generated by the decay of isotope can form electron-hole pair in semiconductors, and this phenomenon is called β-Voltaic Effect. Before long, Elgin-Kidde firstly applied the β-Voltaic Effect in the electric energy supply area in the year of 1957 and successfully prepared the first isotope micro battery β-Voltaic Battery. From 1989, GaN, GaP, AlGaAs, polycrystalline silicon etc. were used one after the other as the material for β-Voltaic Battery. As the development of the preparation and process technology for wide band gap semiconductor material SiC, from 2006, there are relevant reports on the isotope micro battery based on SiC both in domestic and overseas.

Figure 2:
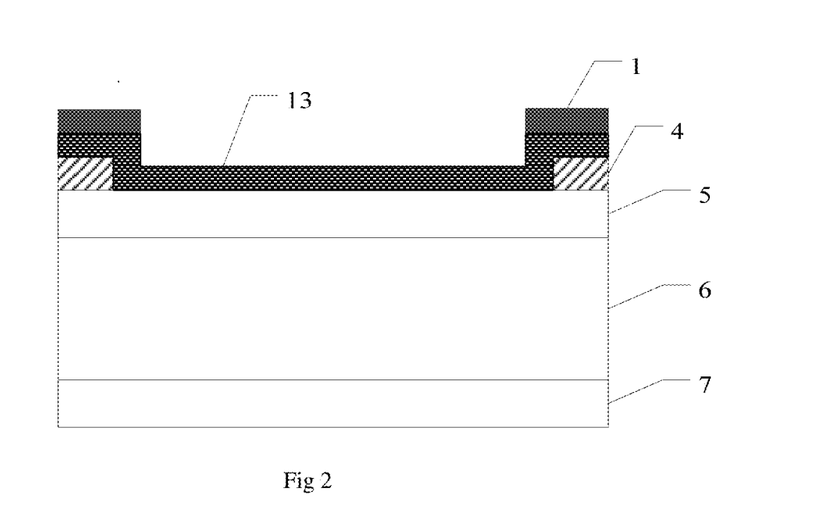
FIG. 2 is a cross section scheme showing the existing Schottky junction nuclear battery.

Patent Document 1 discloses a Schottky junction nuclear battery based on SiC proposed by Lin Zhang, Hui Guo etc. As shown by FIG. 2, said Schottky junction nuclear battery from top to bottom, comprises a bonding layer 1, a Schottky contact layer 13, a SiO₂ passivation layer 4, an n-type low-doping SiC epitaxial layer 5, an n-type high-doping SiC substrate 6, an ohmic contact electrode 7. In the Schottky junction nuclear battery, the Schottky contact layer covers the whole battery area, after the injecting particles reach the surface of the equipment, they will be blocked by the Schottky contact layer and only partial particles can enter into the inside of the equipment, and only the particles entering into the depletion area can have contribution to the output of the battery. Therefore, for the nuclear battery with such structure, the injecting particles lose a large number of energy and the energy conversion is low.

Figure 1:
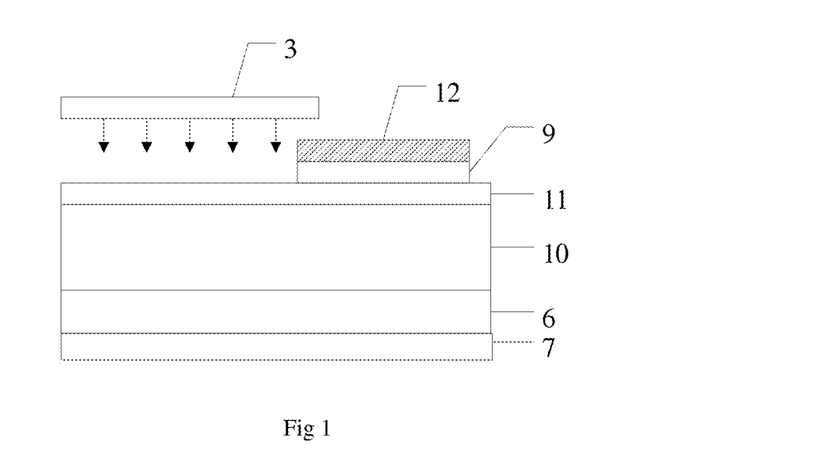
FIG. 1 is a cross section scheme showing the existing p-i-n structure nuclear battery.

Non-patent Document 2 introduces a SiC p-i-n junction nuclear battery proposed by M.V.S. Chandrashekhar, C. I. Tomas, Hui Li, M. G Spencer and Amit Lal etc. from Cornell University in New York, US. As shown by FIG. 1, said p-i-n junction nuclear battery from top to bottom, comprises a radioactive isotope source layer 3, a p-type ohmic contact layer 12, a p-type high doping SiC layer 9, a p-type SiC layer 11, an intrinsic I layer 10, an n-type high doping SiC substrate 6, an ohmic contact electrode 7. In said structure, the substrate is p-type high doping substrate, and the technology of growing epitaxial layer thereon is not mature. So, surface defect is easy to be introduced, the leaking current of the device is increased, and the energy conversion rate is low. Meanwhile, a p-type low doping SiC layer is formed by unintentionally doping epitaxial growing, the doping concentration is high, the width of the resulting depletion area is small and the carrier generated cannot be completely collected, and thus the open circuit voltage of the device is low and the energy conversion rate is low.

In addition, it is known that doping ions such as vanadium, iron etc. can be used to compensate the free carrier in SiC material, and a SiC material having semi-insulation property can be obtained. But, this technology has not been applied in the field of nuclear battery.

PRIOR ART DOCUMENT

Patent Document 1: CN 101325093 A
Non-patent Document 2: Demonstration of a 4H SiC betavoltaic cell, APPLIED PHYSICS LETTERS, 88, 033506, 2006

SUMMARY OF THE INVENTION

In view of the above problems in the prior art, an object of the present invention is to provide an I-layer vanadium-doped PIN type nuclear battery and the preparation process thereof, so as to decrease the I layer carrier concentration, increase the width of the depletion area, and improve the collection ratio of the generated electron-hole pair. Thus, the open circuit voltage of the device and the energy conversion efficiency can be improved.

With respect to the above object, the present invention provides an I-layer vanadium-doped PIN type nuclear battery, which from top to bottom, comprises a radioactive isotope source layer (1), a p-type ohmic contact electrode (4), a SiO₂ passivation layer (2), a SiO₂ dense insulation layer (3), a p-type SiC epitaxial layer (5), an n-type SiC epitaxial layer (6), an n-type SiC substrate (7) and an n-type ohmic contact electrode (8), said radioactive isotope source layer (1) and said p-type ohmic contact electrode (4) are provided on the top surface of said p-type SiC epitaxial layer (5), said SiO₂ dense insulation layer (3) extended to the top surface of the n-type SiC epitaxial layer (6) from the top surface of said p-type SiC epitaxial layer (5) via a lateral bench portion, said SiO₂ passivation layer (2) is laminated on said SiO₂ dense insulation layer (3), characterized in that:

Said p-type SiC epitaxial layer (5) has a doping concentration of $1\times10^{19}\sim5\times10^{19}$ cm$^{-3}$, said n-type SiC substrate (7) has a doping concentration of $1\times10^{18}\sim7\times10^{18}$ cm$^{-3}$, said n-type SiC epitaxial layer (6) is a low doping I layer formed by injecting vanadium ions, and has a doping concentration of $1\times10^{13}\sim5\times10^{14}$ cm$^{-3}$.

In addition, the present invention provides a process for preparing an I-layer vanadium-doped PIN type nuclear battery which at least comprises the following steps:

(1) an original n-type SiC epitaxial layer with a doping concentration of $1\times10^{15}\sim5\times10^{15}$ cm$^{-3}$ is epitaxially grown on an n-type SiC substrate with a doping concentration of $1\times10^{18}\sim7\times10^{18}$ cm$^{-3}$;

(2) vanadium ions are injected into the original n-type SiC epitaxial layer, and then thermal annealing at 1450-1650° C. for 20 to 40 min is performed so as to obtain an n-type SiC epitaxial layer with a doping concentration of $1\times10^{13}\sim5\times10^{14}$ cm$^{-3}$, that is a low doping I layer;

(3) a p-type SiC epitaxial layer with a doping concentration of $1\times10^{19}\sim5\times10^{19}$ cm$^{-3}$ is epitaxially grown on said n-type SiC epitaxial layer.

Preferably, the process for preparing PIN type nuclear battery of the present invention further comprises the following steps:

(4) a bench portion with a height of 0.2 µm-0.6 µm is etched on the lateral side of said p-type SiC epitaxial layer and said n-type SiC epitaxial layer;

(5) a $SiO_2$ dense insulation layer is formed from the top surface of said p-type SiC epitaxial layer and extends to the top surface of the n-type SiC epitaxial layer (6) via said bench portion;

(6) a $SiO_2$ passivation layer is deposited on said $SiO_2$ dense insulation layer;

(7) said $SiO_2$ passivation layer is glued on, a resistance layer is prepared by photoetching, and HF acid is used for etching and windowing;

(8) the front side of the sample obtained by windowing is glued on, an electrode metal area is formed by photoetching using photolithography mask having a shape of p-type electrode, then Ti/Al/Au alloy is deposited by magnetron sputtering, and then is peeled, a p-type electrode pattern is formed on the top surface of said p-type SiC epitaxial layer;

(9) Ni/Cr/Au alloy is deposited on the back side of said sample by magnetron sputtering, and a n-type contact electrode is formed on the lower surface of said n-type SiC substrate;

(10) the whole sample undergoes a rapid thermal annealing in nitrogen atmosphere, a p-type and a n-type ohmic contact electrode are formed at the same time;

(11) an isotope source layer is selectively plated on the top surface of said p-type SiC epitaxial layer.

Compared with the prior art, the present invention has the following advantages:

In the PIN nuclear battery prepared by the present invention, since the n-type SiC epitaxial layer i.e., a low doping I layer is obtained by epitaxially growing with nitrogen doping, and then injecting vanadium ions therein to compensate the free carrier on the epitaxial layer energy level, the doping concentration of the carrier in I layer is extremely low, the width of the depletion area is increased, and the collection ratio of the generated electron-hole pair is improved. Thus, the open circuit voltage of the device and the energy conversion efficiency are improved. Meanwhile, since the p-type SiC epitaxial layer is a thin layer with a thickness of 0.2 µm-0.5 µm, the blocking effect of the epitaxial layer to the injecting particles can be effectively lowered, and the energy conversion efficiency can be effectively improved. Moreover, since the present invention adopts a n-type SiC substrate, the price is cheap, and the technology for the growth of the epitaxial layer is mature, the operation is simple and the PIN nuclear battery is easy to be achieved.

EMBODIMENT

Figure 3:
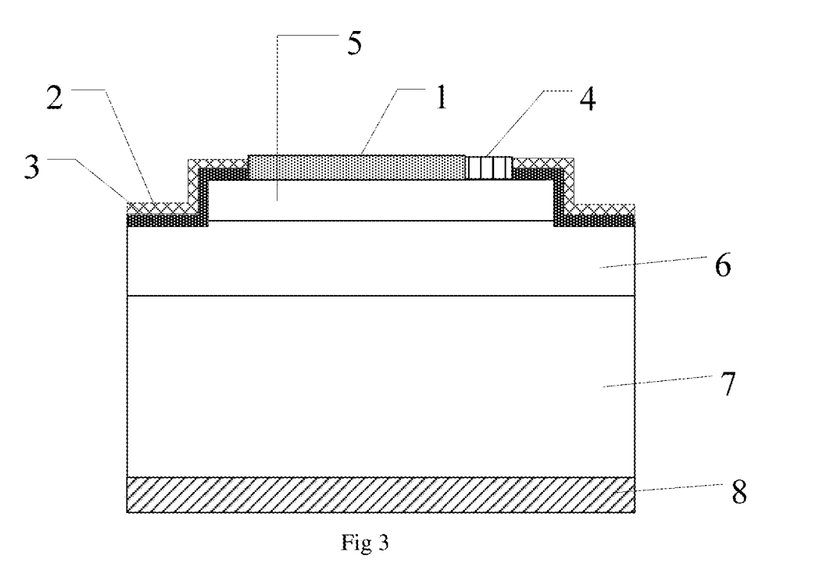
FIG. 3 is a cross section scheme showing the nuclear battery of the present invention.

Below, one example of the inventive nuclear battery will be illustrated according to FIG. 3.

The nuclear battery of the present invention from top to bottom, comprises a radioactive isotope source layer 1, a $SiO_2$ passivation layer 2, a $SiO_2$ dense insulation layer 3, a p-type ohmic contact electrode 4, a p-type SiC epitaxial layer 5, a low doping n-type SiC epitaxial layer 6, an n-type SiC substrate 7 and an n-type ohmic contact electrode 8. In said nuclear battery, the radioactive isotope source layer 1 and the p-type ohmic contact electrode 4 are both provided on the top surface of the p-type SiC epitaxial layer 5, the lateral side of the p-type SiC epitaxial layer 5 and of the low doping n-type SiC epitaxial layer 6 are provided with a bench portion, the $SiO_2$ dense insulation layer 3 extended to the top surface of the low doping n-type SiC epitaxial layer 6 from the top surface of the p-type SiC epitaxial layer 5 via the lateral bench portion, the $SiO_2$ passivation layer 2 is laminated on the $SiO_2$ dense insulation layer 3, and thus constitutes the inventive PIN type nuclear battery.

In the inventive nuclear battery, under the n-type SiC substrate 7, there is an n-type ohmic contact electrode 8 consisted of 200 nm/50 nm/100 nm Ni/Cr/Au alloy, above the n-type SiC substrate 7, there is a low doping n-type SiC epitaxial layer 6 with a thickness of 3 µm-5 µm formed by injecting vanadium ions. Above the low doping n-type SiC epitaxial layer 6, there is a p-type SiC epitaxial layer 5 with a thickness of 0.2 µm-0.5 µm. The lateral side of the low doping n-type SiC epitaxial layer 6 and of the p-type SiC epitaxial layer 5 are provided with a bench portion with a height of 0.2 µm-0.6 µm, on the bench portion, there is a $SiO_2$ dense insulation layer 3 with a thickness of 10 nm-20 nm, above the $SiO_2$ dense insulation layer 3, there is a $SiO_2$ passivation layer 2 with a thickness of 0.3 µm-0.5 µm, the left part on the top surface of the p-type SiC epitaxial layer 5 is provided with a p-type ohmic contact electrode 4 consisted of 50 nm/100 nm/100 nm of Ti/Al/Au alloy and the right part thereon is a radioactive isotope source layer 1.

The inventive PIN nuclear battery characterized in that the p-type SiC epitaxial layer 5 has a doping concentration of $1\times10^{19} \sim 5\times10^{19}$ cm$^{-3}$, the n-type SiC substrate 7 has a doping concentration of $1\times10^{18} \sim 7\times10^{18}$ cm$^{-3}$, the low doping n-type SiC epitaxial layer 6 is a low doping I layer formed by injecting vanadium ions, and has a doping concentration of $1\times10^{13} \sim 5\times10^{14}$ cm$^{-3}$.

In the present invention, vanadium ions are injected into SiC, that is, the free carrier on the shallow impurity level is compensated by the vanadium impurity level, so as to obtain SiC material with semi-insulation property. The maximum concentration of vanadium impurities injected into the n-type SiC epitaxial layer must be higher than the concentration of the remaining carrier in the original n-type SiC epitaxial layer 2 after nitrogen doping (doping concentration). Thus, the vanadium ions can be enough to compensate the free carrier in the n-type SiC epitaxial layer, and meet the requirement of the present invention.

The injecting energy of the vanadium ions is preferably from 2000 KeV to 2500 KeV. If the injecting energy is lower than 2000 KeV, it is possible that the depth of the maximum injecting is shallow and cannot meet the desired effects, and if the injecting energy is higher than 2500 KeV, it is possible that the injecting ions have a high energy and collide with the nucleus in the semiconductor. Since after acquiring energy larger than its shifting energy, the nucleus leaves the lattice position, the defect may be caused. It is further preferred that the injecting energy is 2050 KeV to 2300 KeV, and 2100 KeV to 2200 KeV is particularly preferred.

In addition, the low doping n-type SiC epitaxial layer (6) has a thickness of 3 µm-5 µm. If the thickness of the n-type SiC epitaxial layer (6) is lower than 3 µm, the electron-hole pair generated by irradiation cannot be completely collected, and if the thickness is larger than 5 µm, the resistance in series is large and infects the property of the battery. The further preferred range is 3 μm-4 μm, particularly preferred as 3.2 μm-3.7 μm.

Considering the above factors, the injecting amount of the vanadium ions is preferably $5\times10^{13}\sim1\times10^{15}$ cm$^{-2}$. If the injecting amount is less than $5\times10^{13}$ cm$^{-2}$, the width of the depletion layer is larger than the average injecting range of β-particles, which renders that the energy of β-particles cannot be completely released in the depletion layer. If the injecting amount is more than $1\times10^{15}$ cm$^{-2}$, the life and diffusion length of small amount of carrier would be dramatically decreased. The further preferred range is $1\times10^{14}\sim1\times10^{15}$ cm$^{-2}$, particularly preferred as $5\times10^{14}\sim1\times10^{15}$ cm$^{-2}$.

In addition, the p-type SiC epitaxial layer (5) preferably has a thickness of 0.2 μm-0.5 μm. By setting the thickness of the p-type SiC epitaxial layer (5) as 0.2 μm-0.5 μm, the blocking effect of the epitaxial layer to the injecting particles can be effectively decreased and the energy conversion efficiency can be effectively improved. If the thickness of the p-type SiC epitaxial layer (5) is less than 0.2 μm, it is possible that the good ohmic contact cannot be formed, and if the thickness is more than 0.5 μm, the quality of the epitaxial layer may be lowered. The further preferred range is 0.2 μm-0.4 μm, particularly preferred as 0.25 μm-0.3 μm.

The SiO$_2$ dense insulation layer (3) preferably has a thickness of 10 nm-20 nm. By setting the thickness of the SiO$_2$ dense insulation layer (3) as 10 nm-20 nm, the surface leaking current of the device can be decreased, and the reliability and stability of the device can be improved. If the thickness of the SiO$_2$ dense insulation layer (3) is less than 10 nm, it is possible that the leaking current is formed on the surface of the device, and the device cannot operate normally, and if the thickness is more than 20 nm, it requires a longer oxidation time, which increases the preparation cost.

The SiO$_2$ passivation layer (2) preferably has a thickness of 0.3 μm-0.5 μm. By setting the thickness of the SiO$_2$ passivation layer (2) as 0.3 μm-0.5 μm, the surface of the device can be isolated from the outside environment, and eliminate the influence of the outside environment on the surface state of the 4H—SiC and the property of the device, so as to improve the reliability and stability of the device and to achieve a better passivation effects. If the thickness of the SiO$_2$ passivation layer (2) is less than 0.3 μm, it is possible that the property of the device is influenced by the outside environment, and if the thickness is more than 0.5 μm, it requires a longer growing time, which decreases the efficiency. The further preferred range is 0.3 μm-0.45 μm, particularly preferred as 0.35 μm-0.4 μm.

Figure 4:
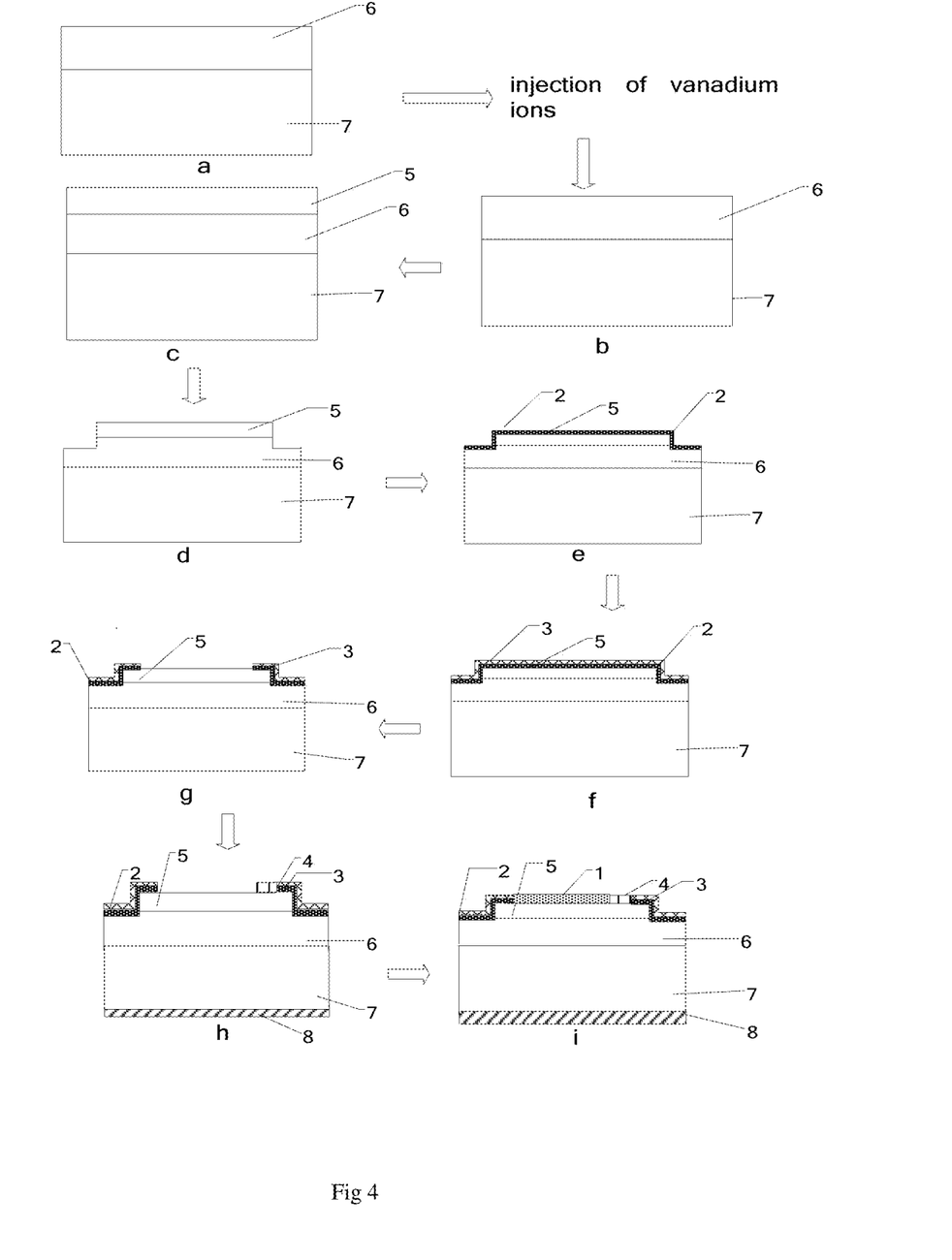
FIG. 4 is a scheme showing the preparing process of the nuclear battery of the present invention.

The process for preparing the nuclear battery of the present invention characterized in that: an original n-type SiC epitaxial layer is epitaxially grown on a high doping n-type SiC substrate, vanadium ions are injected into the original n-type SiC epitaxial layer so as to lower the doping concentration of the I layer and obtain a low doping n-type SiC epitaxial layer, and a high doping p-type SiC epitaxial layer is epitaxially grown on said low doping n-type SiC epitaxial layer. Except for the above, each layer in the nuclear battery can be prepared according to conventional method. FIG. 4 is a scheme showing the preparing process of the inventive nuclear battery.

Referring to FIG. 4, three examples are provided for the preparation process of the present invention. It needs to be noted that the examples are only illustrative for the present preparation process, and the conditions disclosed therein do not make any restriction to the scope of the present invention.

EXAMPLE 1

Step 1: an n-type epitaxial layer was epitaxially grown on a high doping n-type SiC substrate, shown as in FIG. 4a.

A high doping n-type SiC substrate 7 with a doping concentration of $1\times10^{18}$ cm$^{-3}$ was selected, after cleaning, an original n-type epitaxial layer doped with nitrogen ions with a thickness of 4 μm was epitaxially grown on the high doping n-type SiC substrate, the doping concentration was $1\times10^{15}$ cm$^{-3}$, and the epitaxial temperature was 1570° C., the pressure was 100 mbar, and the reacted gases were silane and propane, the carrier gas was pure hydrogen, and the impurity source was liquid nitrogen.

Step 2: vanadium ions were injected into the original n-type SiC epitaxial layer with a doping concentration of $1\times10^{15}$ cm$^{-3}$, as shown in FIG. 4b.

(2.1) vanadium ions were injected into the original n-type SiC epitaxial layer with a doping concentration of $1\times10^{15}$ cm$^{-3}$, the injecting condition was that the injecting energy of said vanadium ions was 2200 KeV, and the injecting amount was $5\times10^{13}$ cm$^{-2}$.

(2.2) thermal annealing at high temperature was performed on the n-type SiC epitaxial layer after the ion-injection, so as to make the injection ions redistributed and lower the defect of the lattice, a low doping n-type SiC epitaxial layer with a doping concentration of $1\times10^{13}$ cm$^{-3}$ was obtained, and the condition for the high temperature thermal annealing was that the annealing temperature was 1450° C., and the annealing time was 30 min Step 3: a high doping p-type SiC epitaxial layer was epitaxially grown thereon, as shown in FIG. 4c.

A p-type SiC epitaxial layer doped with Al ions having a thickness of 0.5 μm was epitaxially grown on said low doping n-type SiC epitaxial layer, the doping concentration was $5\times10^{19}$ cm$^{-3}$, the epitaxial temperature was 1570° C. and the pressure was 100 mbar. The reacted gases were silane and propane, the carrier gas was pure hydrogen, and the impurity source was trimethyl aluminum.

Step 4: a bench portion was formed by photoetching, as shown in FIG. 4d.

(4.1) the sample with p-type SiC epitaxial layer grown on was cleaned according to RCA cleaning standard;

(4.2) after cleaning, a desired pattern was formed on the high doping p-type SiC epitaxial layer with a doping concentration of $5\times10^{19}$ cm$^{-3}$ by photoetching, which uses magnetron sputtering aluminum film as the etching mask layer and uses photolithography;

(4.3) a bench portion with an etching depth of 0.6 μm was etched on the etched pattern by using inductive coupling plasma process.

Step 5: a SiO$_2$ dense insulation layer was formed on the sample surface after the bench portion etching, as shown in FIG. 4e.

At a temperature of 1100+/−50° C., the sample surface after the bench portion etching was oxidized by dry oxygen for two hours, so as to form a SiO$_2$ dense insulation layer 3 with a thickness of 10 nm.

Step 6: a SiO$_2$ passivation layer was grown on the SiO$_2$ dense insulation layer, as shown in FIG. 4f.

Under the condition of 600° C. and pressure of 80 Pa, a SiO$_2$ passivation layer with a thickness of 0.5 μm was deposited on the SiO$_2$ dense insulation layer 3 by low pressure thermal wall chemical vapor deposition process. The reacted gases were silane and propane, and the carrier gas was nitrogen.

Step 7: the SiO₂ passivation layer was glued on, a resistance layer was prepared by photoetching, and HF acid was used for etching and windowing, as shown in FIG. 4g.

(7.1) a photoresist was spin coated on the SiO₂ passivation layer, (7.2) a resistance layer was prepared from the photoresist by using photolithography photoetching, (7.3) a 5% buffering HF acid was used to etch for 10 sec to open a window in the SiO₂ passivation layer, and the windowing area was the effective area of the nuclear battery.

Step 8: the front side of the sample after windowing was glued on, an electrode pattern was formed by photoetching using photolithography mask with a p-type electrode, then 50 nm/100 nm/100 nm of Ti/Al/Au alloy was deposited by magnetron sputtering, then was peeled by ultrasonic wave so as to form p-type electrode contact pattern. Meanwhile, 200 nm/50 nm/100 nm of Ni/Cr/Au alloy was deposited on the back side of the sample substrate by magnetron sputtering so as to form n-type contact electrode, as shown in FIG. 4h.

Step 9: rapid thermal annealing was performed to the whole sample for 3 min at 1100+/−50° C. in an atmosphere of nitrogen, so as to form p-type and n-type ohmic contact electrode at the same time.

Step 10: an isotope source was selectively plated on the top surface of high doping p-type SiC epitaxial layer by electric plating, as shown in FIG. 4i, so as to complete the preparation of I layer vanadium doping PIN type nuclear battery.

EXAMPLE 2

Step 1: an n-type epitaxial layer was epitaxially grown on a high doping n-type SiC substrate, shown as in FIG. 4a.

A high doping n-type SiC substrate 7 with a doping concentration of $5 \times 10^{18}$ cm⁻³ was selected, after cleaning, an original n-type epitaxial layer doped with nitrogen ions with a thickness of 3 μm was epitaxially grown on the high doping n-type SiC substrate, the doping concentration was $5 \times 10^{15}$ cm⁻³, and the epitaxial temperature was 1570° C., the pressure was 100 mbar, and the reacted gases were silane and propane, the carrier gas was pure hydrogen, and the impurity source was liquid nitrogen.

Step 2: vanadium ions were injected into the original n-type SiC epitaxial layer with a doping concentration of $5 \times 10^{15}$ cm⁻³, as shown in FIG. 4b.

(2.1) vanadium ions were injected into the original n-type SiC epitaxial layer with a doping concentration of $5 \times 10^{15}$ cm⁻³, the injecting condition was that the injecting energy of said vanadium ions was 2000 KeV, and the injecting amount was $1 \times 10^{15}$ cm⁻².

(2.2) thermal annealing at high temperature was performed on the n-type SiC epitaxial layer after the ion-injection, so as to make the injection ions redistributed and lower the defect of the lattice, the low doping n-type SiC epitaxial layer with a doping concentration of $5 \times 10^{14}$ cm⁻³ was obtained, and the condition for the high temperature thermal annealing was that the annealing temperature was 1550° C., and the annealing time was 40 min Step 3: a high doping p-type SiC epitaxial layer was epitaxially grown thereon, as shown in FIG. 4c.

A p-type SiC epitaxial layer doped with Al ions having a thickness of 0.4 μm was epitaxially grown on said low doping epitaxial layer, the doping concentration was $1 \times 10^{19}$ cm⁻³, the epitaxial temperature was 1570° C. and the pressure was 100 mbar. The reacted gases were silane and propane, the carrier gas was pure hydrogen, and the impurity source was trimethyl aluminum.

Step 4: a bench portion is formed by photoetching, as shown in FIG. 4d.

(4.1) the sample with p-type SiC epitaxial layer grown on was cleaned according to RCA cleaning standard;

(4.2) after cleaning, a desired pattern was formed on the high doping p-type SiC epitaxial layer with a doping concentration of $1 \times 10^{19}$ cm⁻³ by photoetching, which uses magnetron sputtering aluminum film as the etching mask layer and uses photolithography;

(4.3) a bench portion with an etching depth of 0.6 μm was etched on the etched pattern by using inductive coupling plasma process.

Step 5: SiO₂ dense insulation layer was formed on the sample surface after the bench portion etching, as shown in FIG. 4e.

At a temperature of 1100+/−50° C., the sample surface after the bench portion etching was oxidized by dry oxygen for two hours, so as to form a SiO₂ dense insulation layer 3 with a thickness of 20 nm.

Step 6: a SiO₂ passivation layer was grown on the SiO₂ dense insulation layer, as shown in FIG. 4f.

Under the condition of 600° C. and pressure of 80 Pa, a SiO₂ passivation layer with a thickness of 0.4 μm was deposited on the SiO₂ dense insulation layer 3 by low pressure thermal wall chemical vapor deposition process. The reacted gases were silane and propane, and the carrier gas was nitrogen.

Step 7: the SiO₂ passivation layer was glued on, a resistance layer was prepared by photoetching, and HF acid was used for etching and windowing, as shown in FIG. 4g.

(7.1) a photoresist was spin coated on the SiO₂ passivation layer, (7.2) a resistance layer was prepared from the photoresist by using photolithography photoetching, (7.3) a 5% buffering HF acid was used to etch for 10 sec to open a window in the SiO₂ passivation layer, and the windowing area was the effective area of the nuclear battery.

Step 8: the front side of the sample after windowing was glued on, an electrode pattern was formed by photoetching using photolithography mask with a p-type electrode, then 50 nm/100 nm/100 nm of Ti/Al/Au alloy was deposited by magnetron sputtering, then peeled by ultrasonic wave so as to form p-type electrode contact pattern. Meanwhile, 200 nm/50 nm/100 nm of Ni/Cr/Au alloy was deposited on the back side of the sample substrate by magnetron sputtering so as to form n-type contact electrode, as shown in FIG. 4h.

Step 9: rapid thermal annealing was performed to the whole sample for 3 min at 1100+/−50° C. in an atmosphere of nitrogen, so as to form a p-type and a n-type ohmic contact electrode at the same time.

Step 10: an isotope source was selectively plated on the top surface of high doping p-type SiC epitaxial layer by molecular plating, as shown in FIG. 4i, so as to complete the preparation of I layer vanadium doping PIN type nuclear battery.

EXAMPLE 3

Step A: an n-type epitaxial layer was epitaxially grown on a high doping n-type SiC substrate, shown as in FIG. 4a.

A high doping n-type SiC substrate 7 with a doping concentration of $7 \times 10^{18}$ cm⁻³ was selected, after cleaning, an original n-type epitaxial layer doped with nitrogen ions with a thickness of 5 μm was epitaxially grown on the high doping n-type SiC substrate, the doping concentration was $2 \times 10^{15}$ cm⁻³, and the epitaxial temperature was 1570° C., the pressure was 100 mbar, and the reacted gases were silane and propane, the carrier gas was pure hydrogen, and the impurity source was liquid nitrogen.

Step B: vanadium ions were injected into the original n-type SiC epitaxial layer with a doping concentration of $2\times10^{15}$ cm$^{-3}$, as shown in FIG. 4b.

(B1) vanadium ions were injected into the original n-type SiC epitaxial layer with a doping concentration of $2\times10^{15}$ cm$^{-3}$, the injecting condition was that the injecting energy of said vanadium ions was 2500 KeV, and the injecting amount was $1\times10^{14}$ cm$^{-2}$.

(B2) thermal annealing at high temperature was performed on the n-type SiC epitaxial layer after the ion-injection, so as to make the injection ions redistributed and lower the defect of the lattice, low doping n-type SiC epitaxial layer with a doping concentration of $5\times10^{13}$ cm$^{-3}$ was obtained, and the condition for the high temperature thermal annealing was that the annealing temperature was 1650° C., and the annealing time was 20 min Step C: a high doping p-type SiC epitaxial layer was epitaxially grown thereon, as shown in FIG. 4c.

A p-type SiC epitaxial layer doped with Al ions having a thickness of 0.2 µm was epitaxially grown on said low doping epitaxial layer, the doping concentration was $2\times10^{19}$ cm$^{-3}$, the epitaxial temperature was 1570° C. and the pressure was 100 mbar. The reacted gases were silane and propane, the carrier gas was pure hydrogen, and the impurity source was trimethyl aluminum.

Step D: a bench portion was formed by photoetching, as shown in FIG. 4d.

(D1) the sample with p-type SiC epitaxial layer grown on was cleaned according to RCA cleaning standard;

(D2) after cleaning, a desired pattern was formed on the high doping p-type SiC epitaxial layer with a doping concentration of $2\times10^{19}$ cm$^{-3}$ by photoetching, which uses magnetron sputtering aluminum film as the etching mask layer and uses photolithography;

(D3) a bench portion with a etching depth of 0.5 µm was etched on the etched pattern by using inductive coupling plasma process.

Step E: a SiO$_2$ dense insulation layer was formed on the sample surface after the bench portion etching, as shown in FIG. 4e.

At a temperature of 1100+/−50° C., the sample surface after the bench portion etching was oxidized by dry oxygen for two hours, so as to form a SiO$_2$ dense insulation layer 3 with a thickness of 15 nm.

Step F: a SiO$_2$ passivation layer was grown on the SiO$_2$ dense insulation layer, as shown in FIG. 4f.

Under the condition of 600° C. and pressure of 80 Pa, a SiO$_2$ passivation layer with a thickness of 0.3 µm was deposited on the SiO$_2$ dense insulation layer 3 by low pressure thermal wall chemical vapor deposition process. The reacted gases were silane and propane, and the carrier gas was nitrogen.

Step G: the SiO$_2$ passivation layer was glued on, a resistance layer was prepared by photoetching, and HF acid was used for etching and windowing, as shown in FIG. 4g.

(G1) a photoresist was spin coated on the SiO$_2$ passivation layer, (G2) a resistance layer was prepared from the photoresist by using photolithography photoetching, (G3) a 5% buffering HF acid was used to etch for 10 sec to open a window in the SiO$_2$ passivation layer, and the windowing area was the effective area of the nuclear battery.

Step H: the front side of the sample after windowing was glued on, an electrode pattern was formed by photoetching using photolithography mask with a p-type electrode, then 50 nm/100 nm/100 nm of Ti/Al/Au alloy was deposited by magnetron sputtering, then was peeled by ultrasonic wave so as to form p-type electrode contact pattern. Meanwhile, 200 nm/50 nm/100 nm of Ni/Cr/Au alloy was deposited on the back side of the sample substrate by magnetron sputtering so as to form n-type contact electrode, as shown in FIG. 4h.

Step I: rapid thermal annealing was performed to the whole sample for 3 min at 1100+/−50° C. in an atmosphere of nitrogen, so as to form p-type and n-type ohmic contact electrode at the same time.

Step J: an isotope source was selectively plated on the top surface of high doping p-type SiC epitaxial layer by chemical plating, as shown in FIG. 4i, so as to complete the preparation of I layer vanadium doping PIN type nuclear battery.

The above examples do not make any restriction to the present invention, particularly, the injecting energy of the vanadium and the injecting amount can be determined by the concentration of the carrier according to actual needs.

The above PIN type nuclear battery of the present invention has advantages such as high electron-hole pair collection ratio, high open-circuit voltage of the device and high energy conversion efficiency, which can be used as the on-chip power for micro system, power for cardiac pacemaker, and as back up power for cell phone.

What is claimed is:

1. An I-layer vanadium-doped PIN type nuclear battery, which from top to bottom, comprises:
   a radioactive isotope source layer (1);
   a p-type ohmic contact electrode (4), a SiO$_2$ passivation layer (2);
   a SiO$_2$ dense insulation layer (3);
   a p-type SiC epitaxial layer (5);
   an n-type SiC epitaxial layer (6), an n-type SiC substrate (7); and
   an n-type ohmic contact electrode (8), said radioactive isotope source layer (1) and said p-type ohmic contact electrode (4) are provided on the top surface of said p-type SiC epitaxial layer (5), said SiO$_2$ dense insulation layer (3) extended to the top surface of n-type SiC epitaxial layer (6) from the top surface of said p-type SiC epitaxial layer (5) via lateral bench portion, said SiO$_2$ passivation layer (2) is laminated on said SiO$_2$ dense insulation layer (3), characterized in that said p-type SiC epitaxial layer (5) has a doping concentration of $1\times10^{19}$~$5\times10^{19}$ cm$^{-3}$, said n-type SiC substrate (7) has a doping concentration of $1\times10^{18}$~$7\times10^{18}$ cm$^{-3}$, said n-type SiC epitaxial layer (6) is a low doping I layer formed by injecting vanadium ions, and has a doping concentration of $1\times10^{13}$~$5\times10^{14}$ cm$^{-3}$.

2. The I-layer vanadium-doped PIN type nuclear battery according to claim 1, characterized in that injecting energy of said vanadium ions is from 2000 KeV to 2500 KeV, and injecting amount is from $5\times10^{13}$~$1\times10^{15}$ cm$^{-2}$.

3. The I-layer vanadium-doped PIN type nuclear battery according to claim 1 characterized in that said n-type SiC epitaxial layer (6) has a thickness of 3 µm-5 µm.

4. The I-layer vanadium-doped PIN type nuclear battery according to claim 1, characterized in that said p-type SiC epitaxial layer (5) has a thickness of 0.2 µm-0.5 µm.

5. The I-layer vanadium-doped PIN type nuclear battery according to claim 1, characterized in that said SiO$_2$ dense insulation layer (3) has a thickness of 10 nm-20 nm.

6. The I-layer vanadium-doped PIN type nuclear battery according to claim 1, characterized in that said $SiO_2$ passivation layer (2) has a thickness of 0.3 μm-0.5 μm.

\* \* \* \* \*